ELECTROLYTIC ETCHING OF PLATINUM FOR METALLIZATION

Filed Sept. 12, 1968

INVENTOR.
James R. Black

BY
Mueller, Aichele & Rauner
Attys

United States Patent Office 3,560,358
Patented Feb. 2, 1971

3,560,358

ELECTROLYTIC ETCHING OF PLATINUM FOR METALLIZATION

James R. Black, Scottsdale, Ariz., assignor to Motorola, Inc., Franklin Park, Ill., a corporation of Illinois Filed Sept. 12, 1968, Ser. No. 759,344
Int. Cl. B23p *1/00*
U.S. Cl. 204—143 4 Claims

ABSTRACT OF THE DISCLOSURE

A platinum thin film is patterned by a selective etching process, including the step of depositing the platinum film on a conductive substrate, followed by the application of a photoresist film on the platinum film, patterned in the same image as desired in the platinum. The composite structure is then subjected to alternating current electrolysis in a bath comprising an electrolyte which forms a soluble complex with the platinum. The technique is specifically applied to the fabrication of semiconductor devices with titanium-platinum metallization.

BACKGROUND OF THE INVENTION

This invention relates to the delineation of platinum thin films, and more particularly to the patterning of such films by selective etching with alternating current electrolysis. The method is used in the fabrication of semiconductor microelectronic structures.

Overlay metallization has become a standard practice in the fabrication of a wide variety of semiconductor devices. To be suitable for use in overlay metallization, a metal must (1) be capable of making good ohmic contact to the semiconductor, (2) be an excellent conductor, (3) adhere well to the semiconductor and to silicon dioxide or other passivation films, (4) be chemically compatible with the passivation layer, (5) provide a suitable base for the attachment of leads, and (6) be amendable to selective etching procedures for the delineation of desired patterns.

From the standpoint of convenience and cost reduction, it is obviously desirable to select a single metal capable of satisfying all these requirements. Aluminum has been found satisfactory for a wide range of applications, and is the only metal which has seen widespread commercial use for overlay metallization. Aluminum is far from perfect, however, and the need for continued improvement in metallization systems is recognized throughout the industry.

Numerous two-layer and three-layer metallization systems have been thoroughly investigated as an alternate approach. That is, a first metal layer is deposited, capable of forming particularly good ohmic contact with the semiconductor and capable of adhering to the passivation layer without chemical or physical interaction, followed by the deposition of one or more additional layers to provide the best possible surface for lead attachment. Examples of such plural-layer systems include molybdenum-gold, aluminum-molybdenum-gold, aluminum-nickel, aluminum-nichrome, chromium-gold, etc. Increasing attention has been given recently to platinum-comprising systems including titanium-platinum-gold, chromium-platinum, and to the use of platinum alone. The delineation of platinum films has been difficult, however, because of its etch resistance, and because the usual photoresist compositions used in selective etching techniques fail to provide adequate etch resistance to aqua-regia, which is the only common chemical etch that attacks platinum at a satisfactory rate using convenional procedures.

THE INVENTION

It is an object of the invention to provide an improved technique for the delineation of platinum thin films. It is a further object to provide an improved platinum-film metallization procedure for semiconductor device fabrication, alone or in combination with one or more other metal films.

It is a further object of the invention to facilitate the patterning of plural-layer platinum-comprising metallization films by providing an improved electrolytic method for the selective etching of a platinum film with alternating current.

A primary feature of the invention involves the deposition of a platinum thin film on a conductive substrate, followed by selective electrolytic etching with alternating current. This is accomplished by first patterning a photoresist film on the platinum film, and providing the photoresist with the same image as desired in the platinum. The exposed surfaces of the platinum film are then subjected to alternating current electrolysis by immersion in a bath containing an electrolyte that readily forms a soluble complex with the platinum ions formed at the surface of the film.

Use of the conductive substrate as one electrode during the electrolysis step ensures a continuous, even flow of current to the areas where the platinum is being removed. Electrolysis conditions are selected to prevent further etching, once the exposed portions of the platinum film are completely removed. In a specific embodiment, the invention includes the additional feature of using the patterned platinum film as a mask in the further etching of one or more underlying metal films.

The method of the invention is also useful in the delineation of a platinum film deposited directly on a silicon dioxide passivation layer, or other insulating film. In such an embodiment the electrolysis current is passed directly through the platinum film. This technique has certain limitations, however, since it cannot be used alone to provide a patterned platinum film having one or more isolated platinum areas, because the flow of current is interrupted at any point where the platinum is removed. The complete removal of platinum from any given area when using the platinum film itself as the sole conductor will similarly be recognized as impossible. However, the method of the invention is nevertheless useful in the selective etching of platinum films deposited on insulated layers, provided only that the final increments of platinum adjacent the insulating base must be removed by other techniques, including the use of aqua regia, for example.

The invention is embodied in a method for selectively etching a platinum film beginning with the step of depositing the platinum film on a conductive substrate, and depositing a photosensitive, etch-resistant film on the platinum. The resist is patterned to provide the same image as desired in the platinum film. The composite structure is then immersed in an electrolytic bath comprising an electrolyte capable of forming a soluble complex with the platinum. A graphite rod or other inert electrode is also immersed in the electrolytic bath. A suitable AC voltage is applied between the graphite rod and the conductive substrate on which the platinum film is deposited. For example, when a titanium film is used as the conductive base under the platinum, the applied voltage is limited to a value less than 0.75 volt to prevent etching of the titanium after removal of the platinum.

The invention is also embodied in a method for providing a passivated semiconductor microelectronic structure with titanium-platinum metallization, beginning with the step of selective etching to provide windows in the passivation layer at locations where contact with the semiconductor structure is desired. A titanium film of suitable thickness is then deposited on the structure whereby ohmic contact with the semiconductor is established at the locations exposed by the selective etching. A platinum film is then deposited on the titanium layer, and a photoresist film is patterned upon the platinum film, followed by alternating current electrolysis, as outlined above. Thereafter, using the platinum pattern as a mask, the titanium film is selectively etched to complete the titanium-platinum metallization pattern.

Use of the invention is contemplated whenever it is desired to pattern a platinum film. A particularly attractive use is found in the fabrication of microelectronic semiconductor devices, including particularly integrated monolithic silicon circuits. It is known to provide such circuits with a surface layer of dielectric passivation consisting for example, of silicon dioxide, silica-alumina, silicon nitride, or combinations of any two or more such materials. In providing such structures with a metallization system patterned in accordance with the invention, windows are etched in the passivation layer using known techniques. A titanium layer of suitable thickness, for example 500 to 2,500 angstroms, is provided by known methods, including vacuum evaporation or sputtering. A platinum layer of 1,000 to 3,000 angstroms is thereafter applied covering the titanium layer. Preferably, the platinum deposition is continued in the same apparatus as the titanium, without exposing the titanium to the atmosphere.

Suitable results are also obtained by substituting other refractory metals for titanium. Particularly useful alternates include chromium, tantalum, molybdenum, nickel and zirconium. Other metals of the platinum palladium family may be substituted for the platinum, although not necessarily with equivalent results. Specifically, palladium, rhodium, iridium, osmium, ruthenium, and alloys thereof may be substituted for the platinum.

DRAWINGS

Figures 1, 2, 3, 4, 5, 6:
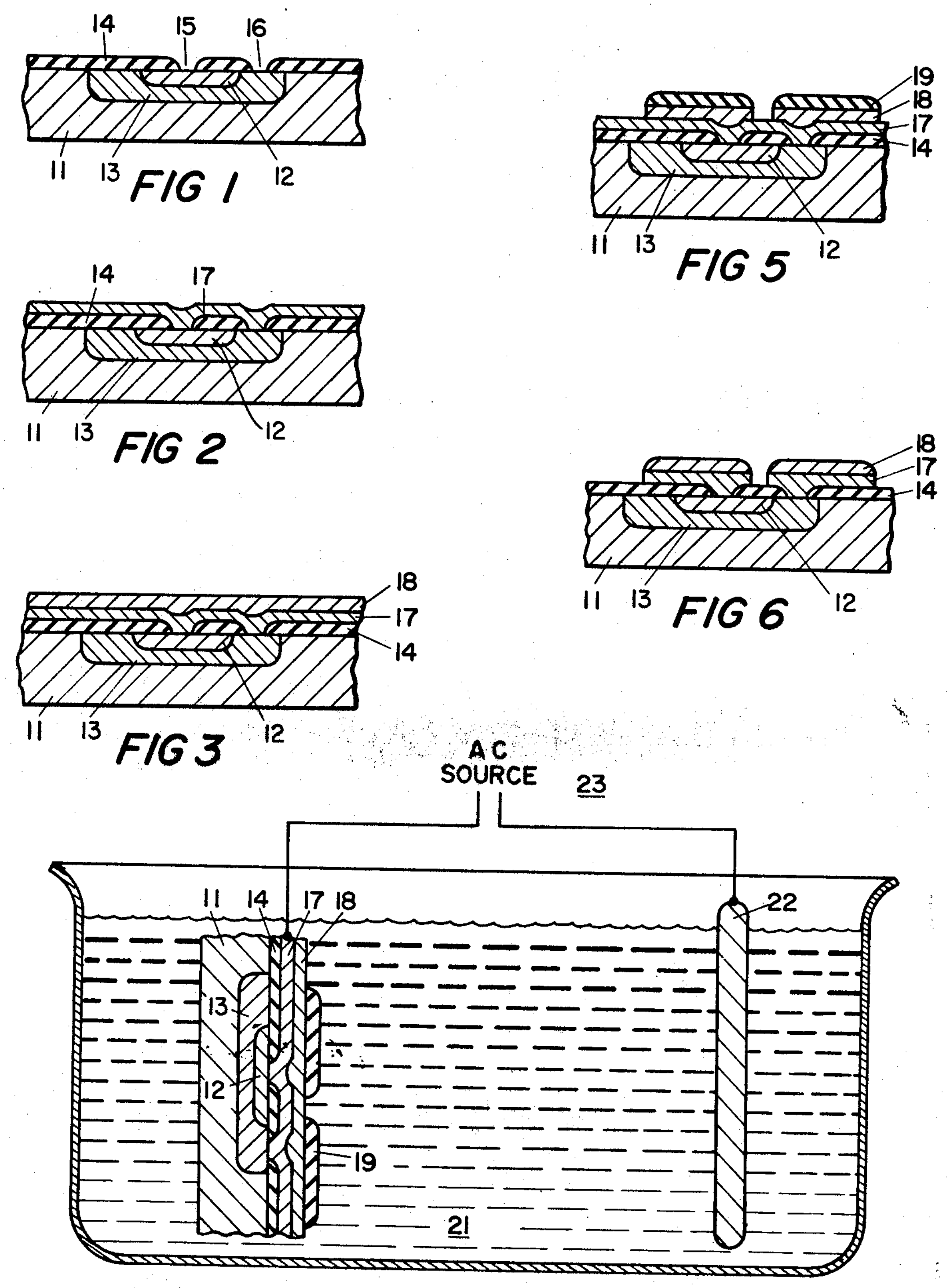
FIG. 1 is a greatly enlarged cross section of a microelectronic semiconductor structure to be metallized in accordance with the invention.
FIGS. 2 through 5 are greatly enlarged cross sections illustrating various intermediate stages in the process of the invention.
FIG. 6 is a greatly enlarged cross section illustrating a metallization system completed in accordance with the one embodiment of the invention.

As shown in FIG. 1, semiconductor body 11 is provided with an emitter zone 12 and base 13. Passivation layer 14 is provided with windows 15 and 16 for the purpose of establishing contact with the emitter and base respectively. Semiconductor 11 is usually silicon or germanium. Other semiconductive materials may be used including, for example, gallium arsenide and other III–V compound semiconductors. Passivation layer 14 is normally silicon dioxide; however, other materials including silica-alumina, silicon nitride or other dielectric layer may be used. Windows 15 and 16 are formed in accordance with known selective etching procedures.

FIG. 2 illustrates the addition of titanium or other refractory metal film 17 to the structure of FIG. 1, whereby contact is established with emitter 12 and base 13. Titanium layer 17 is added by vacuum evaporation or sputtering, in accordance with known procedures. In FIG. 3 platinum film 18 is added covering titanium film 17, using known procedures.

As shown in FIG. 4, the structure FIG. 3 is provided with a patterned photoresist masking layer 19, and is then immersed in an electrolytic bath 21 which may consist, for example, of a 20% solution by weight of potassium cyanide or sodium cyanide in water. The electrode attachment to the semiconductor structure is made with titanium layer 17. The other electrode of the cell consists of graphite rod 22, or may consist of any conductive material which is inert to chemical attack by the electrolyte, with or without the influence of alternating current.

Power source 23 supplies AC voltage, preferably in the range of 0.1 to 0.75 volt, particularly when titanium is selected as the metallic film underlying the platinum. Sixty-cycle alternating current is typically employed because of convenience. A wide range of frequencies, from 10 cycles to several hundred cycles per second may also be employed.

Other electrolytes may be used, provided they readily form a soluble complex with the platinum. For example, hydrochloric acid (20% by weight) saturated with sodium or potassium chloride is useful.

Using the method of the invention, platinum films having a thickness of 3,000 angstroms or more may be etched into fine-geometry patterns, with high definition and resolution, including etch lines and spacings of 0.2 mil or less.

I claim:

1. A method for the delineation of a platinum film on a conductive substrate comprising:

(a) depositing a platinum film on the substrate;
(b) depositing an insulating film on the platinum film;
(c) patterning the insulating film to form the same image therein as desired in the platinum;
(d) immersing the composite structure and a separate, inert electrode in an electrolytic bath containing an electrolyte capable of forming a soluble complex with platinium ions;
(e) applying an alternating current voltage between the substrate and said electrode whereby the exposed portions of said platinum film are selectively removed from said structure.

2. A method as defined by claim 1 wherein said substrate comprises a passivated microelectronic semiconductor structure, and wherein a first layer of metallization on said passivation layer contacts the semiconductor body through one or more windows in the passivation layer.

3. A method as defined by claim 2 wherein said electrolytic bath comprises 20% by weight potassium cyanide.

4. A method as defined by claim 2 followed by the step of selectively etching the metallization underlying said platinum film using said platinum as an etch-resistant mask.

References Cited

UNITED STATES PATENTS

| | | | |
|---|---|---|---|
| 2,057,272 | 10/1936 | Schumpelt | 204—146 |
| 2,185,858 | 1/1940 | Mason | 204—146 |

ROBERT K. MIHALEK, Primary Examiner

U.S. Cl. X.R.

204—141, 146